United States Patent

Takahashi et al.

[11] Patent Number: 5,416,889
[45] Date of Patent: May 16, 1995

[54] METHOD OF OPTIMIZING COMBINATION BY NEURAL NETWORK

[75] Inventors: Masanobu Takahashi; Kazuo Kyuma, both of Amagasaki, Japan

[73] Assignee: Mitsubishi Denki Kabushiki Kaisha, Tokyo, Japan

[21] Appl. No.: 308,637

[22] Filed: Sep. 19, 1994

Related U.S. Application Data

[63] Continuation of Ser. No. 925,605, Aug. 4, 1992, abandoned.

[30] Foreign Application Priority Data

Aug. 30, 1991 [JP] Japan .................... 3-219571

[51] Int. Cl.⁶ .................... G06F 15/18; G06F 15/60
[52] U.S. Cl. .................... 395/22; 395/21; 395/24; 364/491
[58] Field of Search ............ 395/22, 21, 24; 364/491

[56] References Cited

U.S. PATENT DOCUMENTS

| | | | |
|---|---|---|---|
| 4,495,559 | 1/1985 | Gelatt et al. | 364/148 |
| 4,660,166 | 4/1987 | Hopfield | 395/24 |
| 4,874,963 | 10/1989 | Alspector | 395/24 |
| 5,200,908 | 4/1993 | Date et al. | 364/491 |

OTHER PUBLICATIONS

Neurocomputing Robert Hecht-Nielson Addisen Wesley/1991.
Neuroport: Neurocomputing for Multiobjective Design Optimization for Printed Circuit Board Component Placement Joseph Naft IEEE, Jun. 1989.
A Modified Hopfield Network for Two-Dimensional Module Placement Sriram et al. IEEE May 1990.
Diagnosis of Telephoning Line Cord Component Failures Using an Artificial NN Thompson et al. IEEE, Apr. 1991.
A NN Design for Circuit Partitioning Yih et al. IEEE, Dec. 1990.
"Improvement of Performance of Learning in Boltsman Machine and Application to Reorganization Optimization Problem", Research Materials for System Control Study Meeting, the Institute of Electrical Engineers of Japan, SC-91-2, pp. 17 to 18.

*Primary Examiner*—Allen R. MacDonald
*Assistant Examiner*—Richemond Dorvil
*Attorney, Agent, or Firm*—Wolf, Greenfield & Sacks

[57] ABSTRACT

A neural network for solving the problem of the optimization of the arrangement of N (at least two) parts which are combined with each other through connecting wires. After the weights of the synapses of a neuron which is allotted to each part are initially set, a learning process is repeated a predetermined number of times while satisfying restricting conditions. In the learning process, the fittest neurons for all the coordinates of the positions at which the parts are disposed are selected in accordance with a predetermined standard while serially updating the weights of the synapses of the other neurons so as to satisfy the restricting conditions. After the fittest neurons for all the coordinates of the positions are selected, judgement is made as to whether or not the arrangement obtained in the current learning cycle is closer to an optimal arrangement than any other arrangement which has been obtained in previous learning cycles.

71 Claims, 5 Drawing Sheets

METHOD OF OPTIMIZING COMBINATION BY NEURAL NETWORK

This is a continuation of application Ser. No. 07/925,605, filed Aug. 4, 1992, now abandoned.

BACKGROUND OF THE INVENTION

1 Field of the Invention

The present invention relates to a method of optimizing the arrangement of parts or the like.

2 Description of the Related Art

A part arrangement optimization problem will first be explained. If it is assumed, for example, that the positions for arranging four parts and the number of wires between the respective parts are given as shown in Table 1, the parts arrangement optimization problem is how the parts should be arranged in order to make the total length of wiring the shortest.

TABLE 1

|  |  | Number of parts | | | |
|---|---|---|---|---|---|
|  |  | 1 | 2 | 3 | 4 |
| Number | 1 | 0 | 3 | 3 | 1 |
| of | 2 | 3 | 0 | 1 | 3 |
| parts | 3 | 3 | 1 | 0 | 3 |
|  | 4 | 1 | 3 | 3 | 0 |

Examples of the optimal solution and a non-optimal solution to this problem are shown in FIGS. 4a and 4b, respectively. In FIGS. 4a and 4b, the reference numeral 5 represents a part and 6 a wire. The arrangement shown in FIG. 4a is the optimal arrangement and the arrangement shown in FIG. 4b is an example of a non-optimal solution because the total length of wiring is longer than that in FIG. 4a. There is no analytical solution for the part arrangement optimization problem, and it is necessary to examine all the arrangements in order to attain the optimal solution. However, since there are N! combinations for the arrangement of N parts, if N increases, the calculation time for reaching the optimal solution increases enormously. In other words, the part arrangement optimization problem is a kind of combination optimization problem. Therefore, the object of solving this problem is generally to reach an approximate solution, which is approximate to the optimal solution, at a high speed.

FIG. 5 is a flowchart showing a conventional part arrangement optimization algorithm which is described in Takahashi, W. Balzer, Kyuma: *Improvement of Performance of Learning in Boltzmann Machine and Application to Recognition and Optimization Problem* (Research Materials for System. Control Study Meeting, the Institute of Electrical Engineers of Japan, SC-91-2, pp. 17 to 18, Mar. 19, 1991), and which uses a Boltzmann machine model, one of the mutual combination type neural network models.

The conventional algorithm will now be explained. This algorithm is used to (approximately) optimize the arrangement of N parts when N parts (part numbers 1 to N) and N positions (position numbers 1 to N) are given. One neuron is allotted to each combination (there are $N^2$ combinations) of a position number and a part number (step ST13). For example, Table 2 shows an example of the allotment of 4 parts.

TABLE 2

|  |  | Position number | | | |
|---|---|---|---|---|---|
|  |  | 1 | 2 | 3 | 4 |
| Number | 1 | $n_1$ | $n_2$ | $n_3$ | $n_4$ |
| of | 2 | $n_5$ | $n_6$ | $n_7$ | $n_7$ |
| parts | 3 | $n_9$ | $n_{10}$ | $n_{11}$ | $n_{12}$ |
|  | 4 | $n_{13}$ | $n_{14}$ | $n_{15}$ | $n_{16}$ |

The symbol $n_i$ represents an i-th neuron. In this case $N^2$ neurons are used and the state of each neuron represents whether a certain part is disposed at a certain position. For example, the fact that $n_{10}$ is in the excited state (the output of the neuron $n_{10}$ is "1") means that the part 3 is disposed at the position 2. This introduces the following restricting conditions to the state of a neuron. That is, since one part can be disposed only at one position at one time, only one of the four neurons in each row in Table 1 can assume the excited state at one time. Since only one part can be disposed at one position at one time, only one of the four neurons in each column in Table 1 can assume the excited state at one time. The weight of a combination between neurons is then determined in accordance with the following equation (step S14):

$$W_{ij} = c_1 W_{ij}^c + c_2 W_{ij}^s \tag{1}$$

The symbol $W_{ij}$ represents the synaptic weight from a neuron j to i, and $c_1$ and $c_2$ are constants. The symbol $W_{ij}^s$ represents the above-described restricting condition, namely, the suppressive (negative) weight for mutually suppressing the excitation between the neurons in the row and in the column so as to maintain the excited state of only one neuron in one row and in one column. The symbol $W_{ij}^c$ represents the weight which reflects the total length of wiring, and is obtained from the following equation:

$$W_{ij} = c_1 W_{ig}^c + c_2 W_{ij}^s \tag{1}$$

wherein $c_3$ is a constant, $hp_i,p_j$ represents the number of wires between parts $P_i$ and $p_j$, and $dq_i,q_j$ represents the distance between positions $q_i$ and $q_j$, wherein $P_i$ is the residual when i is divided by N, and $q_i$ is the quotient. If $W_{ij} = W_{ji}$, in a mutual combination type neural network model like this example, the energy E of the network is defined by the following equation:

$$E = \sum_{i,j} \{-W_{ij} V_i V_j\} \tag{3}$$

wherein $V_i$ represents the output (excited state: "1", non-excited state: "0") of the i-th neuron. If the weight $W_{ij}$ is determined in accordance with the equations (1) and (2), the energy E is represented as follows:

$$E = c_2 \cdot (\text{total length of wiring}) + (\text{constant}) \tag{4}$$

The energy E does not change or is reduced when the state of the neurons are updated. Therefore, when the state of the neurons are updated serially, the state of the network becomes stable in the state in which the energy E is the minimum. The state of the neurons at this time determines the arrangement of the parts which minimizes the energy E and, hence, which makes the total length of wiring the shortest, as is obvious from the equation (4). Actually, the minimal point of the energy is obtained by using a technique called a simulated annealing method, which updates the state of the neurons stochastically in order to avoid the influence of a local stable point (minimal point) of the energy (step S15). The arrangement of the parts is determined on the basis of the state of the neurons at that time (step S16). This arrangement is the (quasi-)optimal solution.

In the conventional part arrangement optimization algorithm described above, since $N^2$ neurons and $N^4$ weights are necessary for solving the problem for N parts, if the problem is solved by a computer, the memory capacity and the calculation time which are proportional to $N^4$ are necessary, so that this algorithm cannot be applied to a large-scale problem in which the number of parts is large.

SUMMARY OF THE INVENTION

Accordingly, it is an object of the present invention to eliminate the above-described problems in the related art and to provide a part arrangement optimization algorithm which is applicable to a large-scale problem in which the number of parts is large.

To achieve this aim, in one aspect of the present invention, there is provided a neural network for solving the problem of the optimization of the arrangement of N (at least two) parts which are combined with each other through connecting wires, the neural network comprising:
- a) N neurons the number of which is equal proportional to N so that one neuron is allotted to each part;
- b) a means for initially setting the weights of the input synapses of each neuron;
- c) a means for repeating a learning cycle a predetermined number of times at least after the weights of the synapses of each neuron are initially set; and
- d) a means for executing a learning cycle while satisfying restricting conditions, the means including:
  - d1) a means for selecting the fittest neurons for all the coordinates of the positions at which the parts are disposed in accordance with a predetermined standard while serially updating the weights of the synapses of the neurons according to a set of restricting conditions and
  - d2) a means for judging whether or not the arrangement obtained in the current learning cycle is closer to an optimal arrangement than any other arrangement which has been obtained in previous learning cycles after the fittest neurons for all the position coordinates are selected.

According to this structure, N suffices as the number of neurons which are necessary for solving the part arrangement optimization problem. In the case of determining the two-dimensional arrangement of the N parts, the required number of synaptic weights is 2N and in the case of determining the three-dimensional arrangement of the N parts, the required number of synaptic weights is 3N. The memory capacity and the calculation time required for a computer are therefore reduced, thereby enabling the solution of a large-scale problem in which the number of parts is large.

The fittest neuron selecting means includes:
- d11) a means for selecting the coordinates of a position which has not been selected in the current learning cycle and inputting the position coordinates to each neuron as a signal;
- d12) a means for determining the fittest neuron for the input signal from the neurons which have not been selected in the current learning cycle;
- d13) a means for updating the weights of the synapses of the neuron according to a set of restricting conditions after the fittest neuron is selected for the coordinates of the selected position; and
- d14) a means for repeating the steps of inputting a signal, determining the fittest neuron and updating the weights of the synapses until the fittest neurons are selected for all the position coordinates.

The number b of the fittest neuron is determined, for example, in accordance with the following equation:

$$b = \text{argmin}\,(\|Xs - W_i\|^2)$$

wherein Xs represents the position coordinates selected by the signal inputting means, $W_i$ the weights of the synapses of an i-th neuron, and i the number of a neuron which has not been selected in the current learning cycle.

At the time of updating the weights, the amount of update $\Delta W$ determined by the following equation is added to the current weight, for example:

$$\Delta W = (Xs - W_i) \cdot \epsilon \cdot f(i, b)$$

wherein $\epsilon$ is not more than 1, and f(i, b) is a function determined by the following equation:

$$f(i, b) = 1 \quad \text{for } i = b$$
$$f(i, b) = a \cdot h_{ib} \quad \text{for } i \neq b$$

wherein a is a predetermined value and $h_{ib}$ represents the number of the connecting wires between an i-th part and a b-th part.

In evaluating the arrangement, the index for evaluating the arrangement is first calculated and the calculated index is compared with the index obtained in a previous learning. If the current index is regarded to be more approximate to the optimal arrangement than any other index obtained in a previous learning, the current index is stored so as to be used for the next comparison. As the index, the sum of the lengths of the connecting wires may be used.

Random numbers may be set as the initial weights of the synapses of neurons. The position coordinates may also be selected at random. Both $\epsilon$ and a may be constants. Since the parts sometimes include dummy parts which are not connected to any other part, the number of parts may not be coincident with the number of positions.

In another aspect of the present invention, there is provided a computer for solving a part arrangement optimization problem for N (at least two) parts which are connected through connecting wires by a method comprising the steps of:
- a) initially setting the weights of the synapses of a neuron which is allotted to each part;
- b) repeating a learning process a predetermined number of times at least after the weights of the synapses are initially set; and
- c) executing a learning cycle while satisfying restricting conditions,
  by sleeting the fittest neurons for all the coordinates of the positions at which the parts are disposed in accordance with a predetermined standard while serially updating the weights of the synapses of the other neurons so as to satisfy the restricting conditions, and by judging whether or not the arrangement obtained in the current learning cycle is closer to an optimal arrangement than any other arrangement which has been obtained in previous learning cycles after the fittest neurons for all the coordinates of the positions are selected.

In a third aspect of the present invention, there is provided a computer for realizing a neural network model including a plurality of neurons which are connected through a plurality of input lines at the synapses having weights and for solving a part arrangement optimization problem for N (at least two) parts which are connected through connecting wires, the computer comprising:

a) a means for initially setting the weights of the synapses of a neuron which is allotted to each part;
b) a means for repeating a learning cycle a predetermined number of times at least after the weights of the synapses are initially set; and
c) a means for executing a learning cycle while satisfying restricting conditions, including:
   a means for sleeting the fittest neurons for all the coordinates of the positions at which the parts are disposed in accordance with a predetermined standard while serially updating the weights of the synapses of the other neurons so as to satisfy the restricting conditions; and
   a means for judging whether or not the arrangement obtained in the current learning cycle is closer to an optimal arrangement than any other arrangement which has been obtained in previous learning cycles after the fittest neurons for all the coordinates of the positions are selected.

The above and other objects, features and advantages of the present invention will become clear from the following description of the preferred embodiment thereof, taken in conjunction with the accompanying drawings.

DESCRIPTION OF THE PREFERRED EMBODIMENT

The present invention will be explained hereinunder with reference to an embodiment.

Figure 1A:
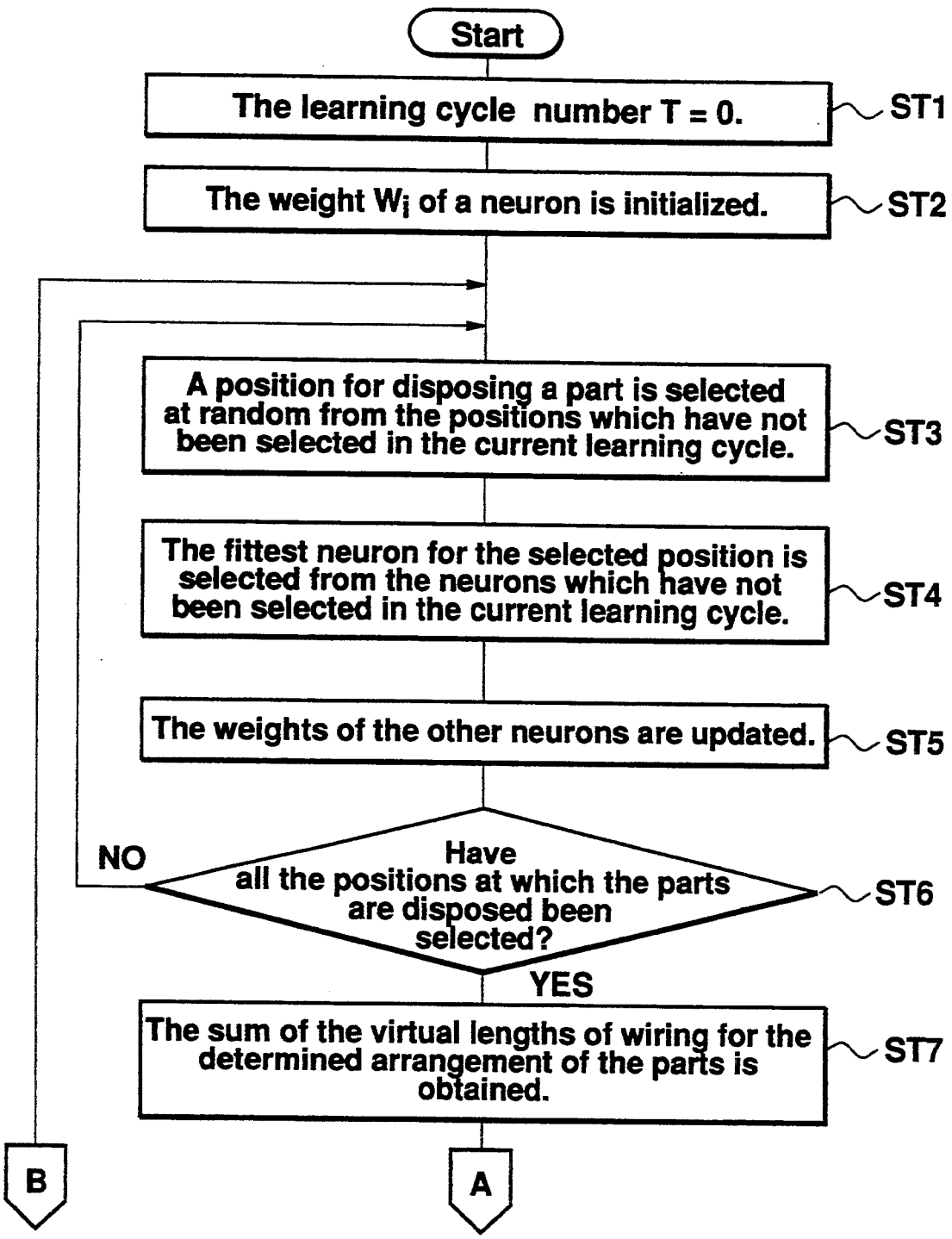
FIG. 1a and 1b are flowcharts of a part arrangement optimization algorithm in an embodiment of the present invention.
Figure 1B:
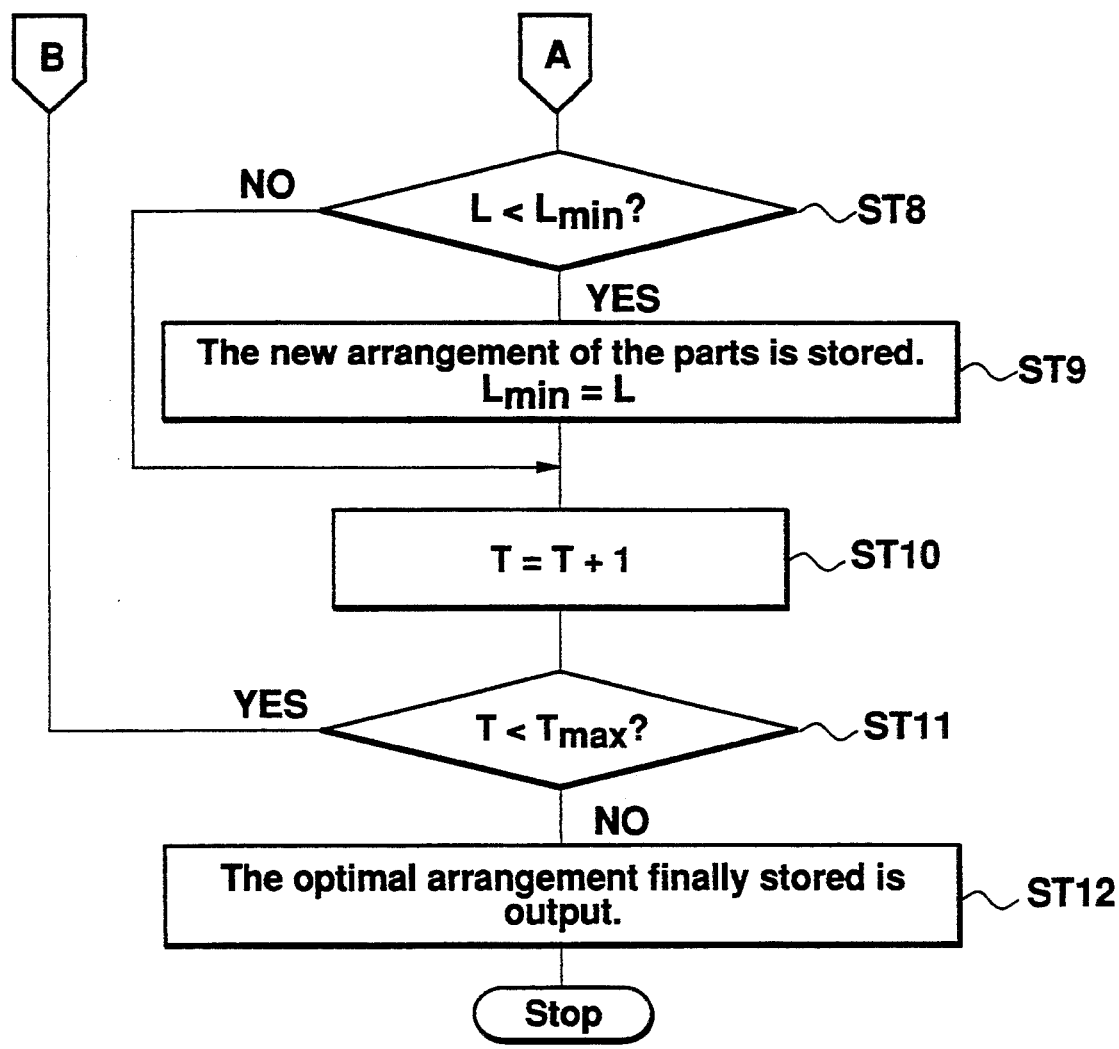
Figure 2:
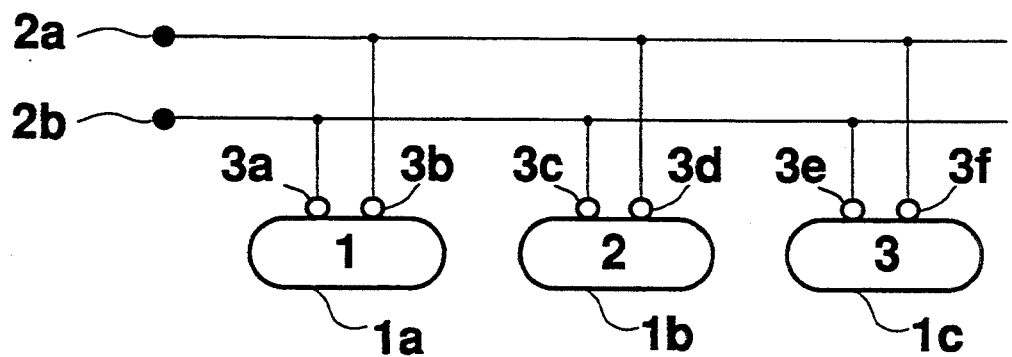
FIG. 2 shows the structure of a neural network model in this embodiment.
Figure 3:
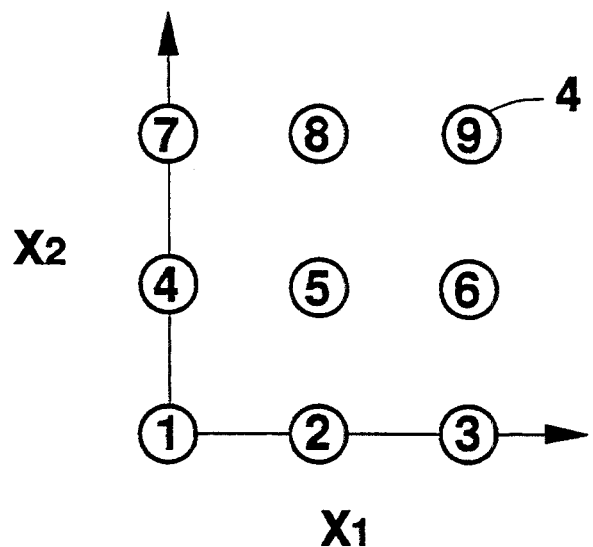
FIG. 3 is an explanatory view of an example of the positions at which 9 parts are disposed in this embodiment.

FIG. 1 is a flowchart of a part arrangement optimization algorithm in an embodiment of the present invention. In this embodiment, N neurons are used for solving the problem for N parts. One neuron is allotted to each part. It is now assumed that an i-th neuron is allotted to an i-th part. In the case of arranging parts two-dimensionally, a neuron has two input lines. Position coordinates are provided for each input line, as will be described later. The neuron i has a two-dimensional weight $W_i = (W_{i1}, W_{i2})$ [i=1 to N] in correspondence with each input line. FIG. 2 shows a neural network model in this embodiment. In FIG. 2, the reference numerals 1a, 1b and 1c represent neurons, 2a, 2b input lines and 3a to 3f synapses having weights. In the case of using N parts, N positions at which the N parts are disposed are determined in advance. FIG. 3 is an example of the positions at which 9 parts are disposed. In FIG. 3, the reference numeral 4 represents the position at which a certain part is disposed, wherein a circle represents the center position at which a certain part is disposed, and the number in the circle represents the position number. The coordinates of each position are represented by $X_i = (X_{i1}, X_{i2})$ [i=1 to N].

Figure 4A:
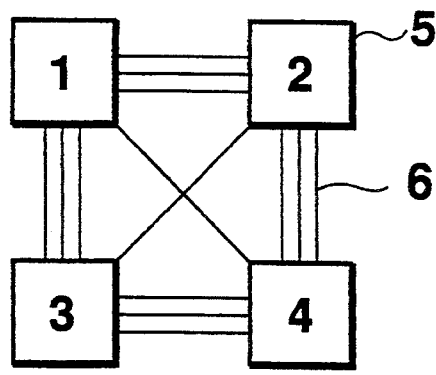
FIGS. 4a and 4b are explanatory views of examples of the optimal arrangement and a non-optimal arrangement of parts when the number of wires connecting the parts is given, as shown in Table 1.
Figure 4B:
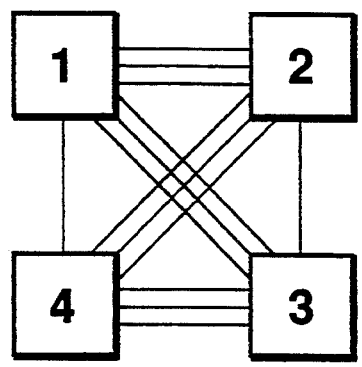
Figure 5:
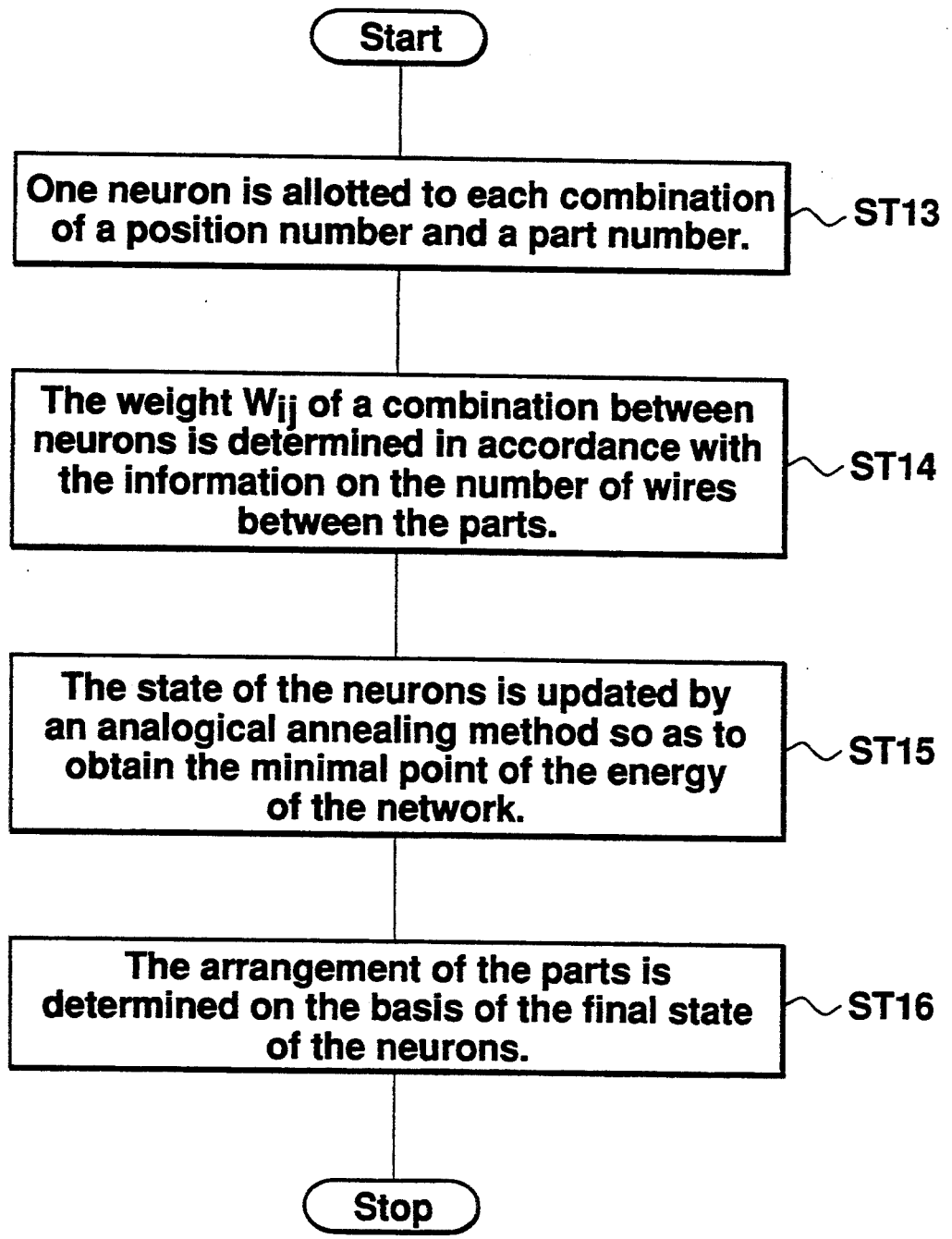
FIG. 5 is a flowchart of a conventional part arrangement optimization algorithm.

The part arrangement optimization algorithm of this embodiment will now be explained with reference to FIG. 1A. The learning cycle number T is first set to "0"0 (step ST1). The weight $W_i$ of a neuron is then initialized, ordinarily, at a random number (step ST2). Thereafter, a first learning is executed. In the first learning, a position S for disposing a part is selected at random from the positions which have not been selected in this learning cycle (step ST3). The position coordinates $X_s$ of the selected position S are input from the input lines 2a and 2b, and the neuron having the weight closest to that of the input signal (this neuron is called the fittest neuron) is selected from the neurons which have not been selected in this learning cycle (step ST4). The number b of the fittest neuron is represented by the following equation (5):

$$b = \underset{i \in U}{\mathrm{argmin}}(||X_s - W_i||^2) \qquad (5)$$

wherein U represents the set of neuron numbers which have not been selected in this learning cycle. For example, if a b-th neuron is selected as the fittest neuron for the position S, this means that the b-th part is disposed at the position S. In consideration of restricting conditions, the weights of the other neurons are updated by the amount of update represented by the following equations (6) and (7) at the next step (ST 5):

$$\Delta W_i = (X_s - W_i) \cdot \epsilon \cdot f(i, b) \qquad (6)$$

$$f(i, b) = \begin{cases} 1 & \text{for } i = b \\ a \cdot h_{ib} & \text{for } i \neq b \end{cases} \qquad (7)$$

wherein $\epsilon$ is a constant called a learning rate and is ordinarily set to be not more than 1, and f(i, b) is 1 when the i-th neuron is the fittest neuron and a $\times h_{ib}$ in the other cases, wherein a is a constant called a wiring constant, and $h_{ib}$ represents the number of connecting wires between the i-th part and a b-th part. Judgement is then made as to whether or not all the positions at which the parts are disposed have been selected in this learning cycle (step ST6). If the answer is in the negative, the process is returned to the selection of a position at which a part should be disposed (step ST3). On the other hand, if all the parts have been selected, the sum L of the virtual lengths of wiring for the determined arrangement of the parts is obtained (step ST7). If the arrangement is that shown in FIG. 4a, for example, the virtual length of wiring is calculated as the sum of the distances in the horizontal direction ($X_l$) and in the vertical direction ($X_2$) of two adjacent positions at which parts are disposed. The sum L with the minimum sum $L_{min}$ of the virtual lengths of wiring of the virtual lengths of wiring obtained is then compared obtained in the previous learning cycles (step ST8). If L is not smaller than $L_{min}$, the process proceeds to step ST10, while if L is smaller than $L_{min}$, the new arrangement of the parts obtained in this learning cycle is stored as the optimal arrangement, and L is substituted into $L_{min}$ as the minimum sum of the virtual lengths of wiring (step ST9). The first learning cycle is thus ended. At the next step (ST10), "1" is added to the learning cycle T. The learning cycle T is then compared with a predetermined maximum number of times $T_{max}$ for learning (step ST11). If T has not reached $T_{max}$, the process returns to step ST3 so as to start the next learning cycle. If T is $T_{max}$, the arrangement of the parts which is finally stored as the optimal arrangement is output as the intended (sub)optimal arrangement (step ST12).

Although the parts are arranged in a two-dimensional lattice, as shown in FIG. 3, in this embodiment, the arrangement is not restricted thereto and may be determined as desired, for example, three-dimensional.

In the above embodiment, the number of positions is equal to the number of parts, but it is possible to similarly optimize the arrangement of parts at positions the number of which is larger than the number of parts by considering dummy parts which are not connected to any other part.

Although the order of selecting the positions at which the parts are disposed is random in this embodiment, the order may be determined in accordance with some standard.

The two parameters $\epsilon$ and a, which are fixed at certain values in this embodiment, may be changed during a learning cycle.

The weight is updated in accordance with the equations (6) and (7) in this embodiment, but the equations are not strictly limitative. For example, a certain change such as the removal of $(X_i - W_i)$ from the equation (6) and a change of "1" on the right-hand side of the equation (7) to "2" similarly enables the optimization of the part arrangement.

Although only the reduction in the total length of wiring as much as possible is aimed at in this embodiment, the optimization of the arrangement of parts including other conditions (e.g., avoidance of crowded wiring and avoidance of the deposition of a specific part at an adjacent position) is also possible. For this purpose, the terms reflecting these conditions may be introduced into the equation (5), for example, and the fittest neuron is selected so as to satisfy these conditions at the step ST 4.

Although the neuron having the weight closest to that of an input signal is selected when the fittest neuron is selected in this embodiment, another neuron may be selected at a certain probability by introducing a noise term into the equation (5), for example. By such a stochastic fluctuation, the abilities of finding the optimal solutions to some problems are enhanced.

This embodiment is applied to a part arrangement optimization problem, but the present invention is not restricted thereto.

As described above, according to the present invention, a method of optimizing the arrangement of N parts comprises a first step of using the weights of the synapses of N neurons, a second step of allotting a neuron to each part, a third step of inputting the coordinates of a position at which a part should be disposed to a neuron as an input signal, a fourth step of selecting the fittest neuron for the input signal on the basis of a preset standard, a fifth step of making the weight of the selected fittest neuron approximating to the input signal, a sixth step of updating the weights of the synapses of the other neurons in accordance with restricting conditions, and a seventh step of repeating the third to sixth steps until all the positions for the N parts are selected while updating the weights of the synapses of the neurons which have not been selected. In this way, since the problem of arranging N parts at optimal positions is solved by using N neurons and the weight of the synapses of these neurons, it is possible to solve a large-scale problem in which the number of parts is large and to greatly reduce the cost (for the calculation time and the memory capacity).

While there has been described what is at present considered to be a preferred embodiment of the invention, it will be understood that various modifications may be made thereto, and it is intended that the appended claims cover all such modifications as fall within the true spirit and scope of the invention.

What is claimed is:

1. A computer-implemented neural network system for arranging a plurality of parts among N positions in M-dimensions, including a plurality of neurons, wherein each neuron has M inputs, each input having a synapse, each synapse having a weight, and each neuron having an output indicative of similarity of the inputs to the weights, the parts being combined with one another through a set of connecting wires, the neural network system comprising:

means for assigning each of the plurality of neurons to a different part;
   means for initializing the weight of each synapse of each neuron; and
   means for executing a learning cycle, comprising:
   means for inputting a position coordinate to the inputs of the neurons, indicative of one of the N positions at which a part can be placed;
   means for selecting a fittest neuron, responsive to the outputs of the neurons, wherein the fittest neuron is the neuron whose weights are most similar to the input position coordinate, and for updating the weights of the synapses of the plurality of neurons according to a set of restricting conditions; and
   means for repetitively operating the means for inputting, means for selecting, and means for assigning, so that a fittest neuron is selected for each of the N positions.

2. A neural network system according to claim 1, wherein the means for initializing the weights of the synapses of each neuron includes means for setting the weights to be random numbers.

3. A neural network system according to claim 1, wherein the means for inputting a position coordinate to the neural network selects one of the N positions at random.

4. A neural network system according to claim 1, wherein the means for selecting the fittest neuron selects a number b such that
   b is an index i for which
   $Xs - W_i \|^2$ is the minimum,
wherein Xs represents the position coordinate, Wi represents weights of an i-th neuron, and i represents a neuron which has not been selected in the current learning cycle.

5. A neural network system according to claim 4, wherein the means for updating the weights of the synapses of each neuron adds an update amount $\Delta Wi$ to the weight of each neuron which is to be updated, such that $$\Delta Wi = (Xs - W_i) \cdot \epsilon \cdot f(i, b)$$

wherein $\epsilon$ is not more than 1, and $$f(i, b) = \begin{cases} 1 & \text{for } i = b \\ a \cdot h_{ib} & \text{for } i \neq b \end{cases}$$

wherein $a$ is a predetermined value and $h_{ib}$ represents the number of the connecting wires between an i-th part and a b-th part.

6. A neural network system according to claim 6, wherein $a$ is a constant.

7. A neural network system according to claim 5 wherein $\epsilon$ is a constant.

8. A neural network system according to claim 5 wherein $\epsilon$, is a constant whose value is selectable.

9. A neural network system according to claim 1, wherein the arrangement of parts include a dummy part which is not connected to any other part.

10. A system according to claim 1, wherein the parts include a dummy part which is not connected to any other part.

11. The system of claim 1, wherein the means for executing a learning cycle further comprises means for assigning the part to which the fittest neuron is assigned to the position identified by the position coordinate.

12. The system of claim 1, further comprising means for repeating a learning cycle a predetermined number of times.

13. The system of claim 12, further comprising means for determining whether an arrangement obtained in the learning cycle is closer to an optimal arrangement than an arrangement obtained in a previous learning cycle.

14. A neural network system according to claim 3, wherein the means for determining whether the arrangement obtained in the current learning cycle is closer to an optimal arrangement comprises:
means for calculating an index for evaluating the arrangement;
means for comparing the calculated index with an optimum index obtained in previous learning cycles; and
means for storing the calculated index and the part arrangement corresponding to the calculated index when the calculated index is closer to the optimal arrangement than the index calculated in previous learning cycles.

15. A neural network system according to claim 14, wherein the index is the sum of a set of lengths of the connecting wires.

16. The system of claim 12, further comprising means for determining whether an arrangement obtained in the learning cycle is closer to an optimal arrangement than any arrangement obtained in any previous learning cycle.

17. A computer-implemented method using a neural network, including a plurality of neurons, for solving a part arrangement optimization problem of placing a plurality of parts among N positions in M-dimensions, wherein each neuron has M inputs, each input having a synapse each synapse having a weight, and each neuron having an output indicative of similarity of the inputs to the weights, the parts being connected through a set of connecting wires, the method comprising the steps of:
assigning each neuron to a different part, of the plurality of parts;
initializing the weight of each synapse of each neuron;
executing a learning cycle, including the steps of:
selecting one of the N positions and inputting a position coordinate identifying the selected position to the inputs of a set of neurons of the plurality of neurons;
selecting a fittest neuron from among the set of nearons, responsive to the outputs of the neurons after the position coordinate has been input, wherein the fittest neuron is the neuron whose weights are most similar to the input position coordinate, and updating the weight of each synapse of each neuron in the set of neurons according to a set of restricting conditions.

18. The method of claim 17, wherein the step of executing a learning cycle further includes the step of assigning the part to which the fittest neuron is assigned to the position identified by the position coordinate.

19. The method of claim 17, further comprising the step of determining an arrangement of parts by repeating a learning cycle a predetermined number of times.

20. The method of claim 19, further comprising the step of determining whether an arrangement obtained in the learning cycle is closer to an optimal arrangement than an arrangement obtained in a previous learning cycle.

21. The system of claim 19, further comprising means for determining whether an arrangement obtained in a current learning cycle is closer to an optimal arrangement than any arrangement obtained in any previous learning cycle.

22. A computer system utilizing a neural network model for optimizing an arrangement of a plurality of parts among N-positions of in M-dimensions, the parts being connected through a set of connecting wires, the computer system comprising:
a neural network having a plurality of neurons, wherein each neuron has M inputs, each input having a synapse, each synapse having a weight, each neuron having an output indicative of a similarity of the inputs to the weights, each neuron being assigned to a different part;
means for initializing the weight of each synapse of each neuron;
means for executing a learning process, comprising:
i) means for selecting one of the N positions and inputting a position coordinate identifying the selected position to the inputs of a set of neurons of the plurality of neurons
ii) means for selecting a fittest neuron from among the set of neurons, responsive to the outputs of the neurons of the set of neurons, wherein the fittest neuron is the neuron whose weights are most similar to the input position coordinate; and
iii) means for updating the weights of the synapses of the set of neurons according to a set of restricting conditions.

23. The system of claim 22, wherein the means for executing a learning cycle includes means for assigning the part to which the fittest neuron is assigned to the available position identified by the coordinate.

24. The system of claim 22, further comprising means for repetitively operating the means for executing a learning cycle a predetermined number of times.

25. The system of claim 24, further comprising means for determining whether an arrangement obtained in the learning process is closer to an optimal arrangement than an arrangement obtained in a previous learning process after a fittest neuron for each of the N positions is selected.

26. The system of claim 24, further comprising means for determining whether an arrangement obtained in the learning process is closer to an optimal arrangement than any arrangement obtained in any previous learning process.

27. A computer-implemented method utilizing a neural network for solving an optimization problem of arranging a plurality of parts among N positions in M-dimensions, the neural network having a plurality of neurons, wherein each neuron has M inputs, each input having a synapse, each synapse having a weight, and each neuron having an output indicative of a similarity of the inputs to the weights, the parts being connected through a set of wires, the method comprising the steps of:
- a) assigning each of the plurality of neurons to a different part, of the plurality of parts, wherein each neuron has at least one synapse and each synapse has a weight;
- b) initializing the weight of each synapse of each neuron;
- c) determining an arrangement of parts by repeating a learning cycle a predetermined number of times, the learning cycle comprising the steps of:
  - i) inputting a position coordinate indicative of one of the N positions to the inputs of a set of neurons, of the plurality of neurons;
  - ii) selecting a fittest neuron, from the set of neurons, responsive to the outputs of the neurons, of the set of neurons, wherein the fittest neuron is the neuron whose weights are most similar to the input position coordinate;
  - iii) updating the weights of each synapse of each neuron according to a set of restricting conditions;
  - iv) assigning the part to which the fittest neuron is assigned to the position identified by the position coordinate; and
  - v) determining whether an arrangement obtained in the learning cycle is closer to an optimal arrangement than an arrangement obtained in a previous learning cycle after the fittest neurons for all the position coordinates are selected.

28. A method according to claim 27, wherein the steps for initializing the weights of the synapses of each neuron includes the step of setting the weights to be random numbers.

29. A method according to claim 27, wherein the steps of selecting the fittest neuron includes the steps of:
selecting a position coordinate of a position which has not been selected in the learning cycle and inputting the position coordinate to each neuron as a signal on a set of input lines;
determining the fittest neuron for the signal from a group of neurons which have not been selected as a fittest neuron in the learning cycle; and
wherein the step of updating includes updating the weight of each synapse of each neuron so as to satisfy the restricting conditions after the fittest neuron is selected.

30. A method according to claim 29, wherein the steps for selecting the coordinate position includes the step of selecting the coordinates position at random.

31. A method according to claim 30, wherein the steps for determining whether the arrangement obtained in the current learning cycle is closer to an optimal arrangement include the steps of:
calculating an index which evaluates the arrangement;
comparing the calculated index with an optimum index calculated in previous learning cycles; and
storing the calculated index and the part arrangement corresponding to the calculated index when the calculated index is closer to the optimal arrangement than the index calculated in previous learning cycles.

32. A method according to claim 22, wherein the parts are interconnected by a set of connecting wires and the index is the sum of the lengths of the connecting wires.

33. A method according to claim 29, wherein the steps for determining the fittest neuron includes the step of determining a number b of the fittest neuron such that b is an index i for which $\|X_s - W_i\|^2$ is the minimum,
wherein $X_s$ represents the selected coordinate position, $W_i$ represents the weights of an i-th neuron, and i represents a neuron which has not been selected in the current learning cycle.

34. A method according to claim 33, wherein the steps for updating the weights of the synapses of each neuron includes the step of adding the amount of update $\Delta W_i$ to the weight of each neuron which is to be updated such that $$\Delta W_i = (X_s - W_i) \cdot \epsilon \cdot f(i, b)$$

wherein $\epsilon$ is not more than 1, and $$f(i, b) = \begin{array}{ll} 1 & \text{for } i = b \\ a \cdot h_{ib} & \text{for } i \neq b \end{array}$$

wherein $a$ is a predetermined value and $h_{ib}$ represents a number of the connecting wires between an i-th part and a b-th part.

35. A method according to claim 34, wherein $a$ is a constant.

36. A method according to claim 34 wherein $\epsilon$ is a constant.

37. A method according to claim 34 wherein $\epsilon$ is a constant which is selectable.

38. A method to claim 15, wherein the arrangement of parts include a dummy part which is not connected to any other part.

39. A system utilizing a neural network for optimizing an arrangement of N parts, wherein N is an integer greater than 1, among N positions of in M-dimensions, the system comprising:
a neural network having a plurality of neurons wherein each neuron is assigned to a different part, wherein each neuron has at least M inputs, each input having a synapse, each synapse having a weight, and each neuron having output indicative of similarity of the inputs to the weights;

means for initializing the weight of each synapse of each neuron;

means for executing a learning process while satisfying restricting conditions, the means for executing comprising:
  i) means for selecting a coordinate at which a part may be disposed, wherein the coordinate position has not been previously selected in the learning cycle;
  ii) means for inputting the coordinate to a set of neurons of the plurality of neurons;
  iii) means for determining a fittest neuron, responsive to the position coordinate and the outputs of the set of neurons, wherein the fittest neuron is the neuron whose weights are most similar to the input position coordinate;
  iv) means for updating the weights of the synapses of the other neurons not previously determined to be a fittest neuron in the learning process so as to satisfy the restricting conditions;
  v) means for assigning the part to which the fittest neuron is assigned to the position identified by the coordinate; and
  vi) means for determining whether an arrangement obtained in the learning process is closer to an optimal arrangement than any other arrangement obtained in any previous learning process, operative after the fittest neurons for all the position coordinates are selected 40. A system according to claim 39, wherein the means for initializing the weights of the synapses of each neuron includes the means for setting the weights to be random numbers.

41. A system according to claim 39, wherein the means for determining the fittest neurons further includes:
  means, within each neuron, for comparing the coordinate to the weights of the neuron; and
  means, responsive to each neuron, for selecting the neuron whose weights are closest to the input coordinate position.

42. A system according to claim 39, wherein the means for selecting a coordinate position selects the coordinate position at random.

43. A system according to claim 39, wherein the means for determining the fittest neuron determines a number b of the fittest neuron such that
  b is an index i for which $\|Xs - W_i\|^2$ is the minimum,
wherein Xs represents the selected position coordinate $W_i$ represents the weights of an i-th neuron, and i represents a neuron which has not been selected in the learning process.

44. A system according to claim 43, wherein the means for updating the weights of the synapses of each neuron adds an update amount $\Delta Wi$ to the weight of each neuron which is to be updated, such that $$f(i, b) = 1 \quad \text{for } i = b$$
$$\alpha \cdot h_{ib} \quad \text{for } i \neq b$$

wherein $\epsilon$ is not more than 1, and
wherein $\alpha$ is a predetermined value, and $h_{ib}$ represents a number of connections between an i-th part and a b-th part.

45. A system according to claim 44, wherein $\alpha$ is a constant.

46. A system according to claim 45, wherein the parts are interconnected by a set of connecting wires and wherein the index is a sum of lengths of the connecting wires.

47. A system according to claim 39, wherein the means for determining whether the arrangement obtained in the current learning process is closer to an optimal arrangement includes:
  means for calculating an index which evaluates the arrangement;
  means for comparing the calculated index with an index calculated in a previous learning process; and
  means, responsive to the means for comparing, for storing the calculated index when the calculated index is closer to the optimal arrangement the index calculated in a previous learning process.

48. A system according to claim 39, wherein the parts include a dummy part which is not connected to any other part.

49. A method for optimizing an arrangement of N parts, wherein N is an integer greater than 1, among N positions of in M-dimensions, the method comprising the steps of:
  a) assigning a neuron to each part, wherein each neuron has at least M inputs, each having a synapse, each synapse having a weight, and each neuron having an output indicative of similarity of the inputs of each neuron to the weight;
  b) initializing the weight of each synapse of each neuron; and
  c) determining an arrangement of parts by repeating a learning cycle, the learning cycle comprising the steps of:
  i) selecting a coordinate position at which a part may be disposed, wherein the coordinate position has not been previously selected in the learning cycle;
  ii) inputting the coordinate position to each neuron;
  iii) determining a fittest neuron, responsive to the outputs of the neurons, not previously determined to be a fittest neuron in the learning cycle, wherein the fittest neuron is the neuron whose weights are most similar to the input position coordinate;
  iv) updating the weights of the synapses of the neurons on the basis of the restricting conditions;
  v) assigning the part to which the fittest neuron is assigned to the position identified by the coordinate; and
  v) determining whether an arrangement obtained in the learning cycle is closer to an optimal arrangement than an arrangement obtained in a previous learning cycle.

50. A method as set forth in claim 49, wherein the step of initializing the weights of the synapses of each neuron is the step of setting the weights to be random numbers.

51. A method as set forth in claim 49 wherein the step of determining the fittest neuron further includes the steps of:
  inputting the selected coordinate position to each neuron as a signal;
  comparing the input coordinate position to the weight of the neuron; and
  selecting the neuron having the weight closest to the input coordinate position.

52. A method as set forth in claim 49 wherein the step of selecting the coordinate position selects the coordinate position at random.

53. A method as set forth in claim 49 wherein the step determining a fittest neuron comprises the steps of:
determining a number b of the fittest neuron such that, b is an index i for which $\|Xs - W_i\|^2$ is the minimum,
wherein Xs represents the selected coordinate position $W_i$ represents the weights of an i-th neuron, and i represents of a neuron which has not been selected in the learning cycle.

54. A method as set forth in claim 53 wherein the step of updating the weights of the synapses of each neuron comprises the steps of:
adding an update amount $\Delta Wi$ to the weight of each neuron which is to be updated, such that $$\Delta W_i = (Xs - W_i) \cdot \epsilon \cdot f(i, b)$$

wherein $\epsilon$ is not more than 1, and $$f(i, b) = 1 \quad \text{for } i = b$$
$$\alpha \cdot h_{ib} \quad \text{for } i \neq b$$

wherein $\alpha$ is a predetermined value, and $h_{ib}$ represents a number of connections between an i-th part and a b-th part.

55. A method as set forth in claim 54 wherein $\alpha$ is a selectable constant.

56. A method as set forth in claim 49 wherein the step of determining whether the arrangement obtained in the current learning cycle is closer to an optimal arrangement includes the steps of:
calculating an index which evaluates the arrangement;
comparing the calculated index with an index calculated in a previous learning cycle; and
storing the calculated index when the calculated index is closer to the optimal arrangement than the index obtained in the previous learning cycle.

57. A method as set forth in claim 56 wherein the parts are interconnected by a set of connecting wires and wherein the index is a sum of lengths of the connections.

58. A method as set forth in claim 49 wherein the parts include a dummy part which is not connected to any other part.

59. A method as set forth in claim 49 further including the steps of updating the weights of the synapses of the fittest neuron just previously determined, and the weights of the synapses of neurons assigned to the parts which are wired to the parts assigned to the fittest neuron.

60. A computer-implemented method for utilizing a neural network model for optimizing an arrangement of parts among N positions in M-dimensions, the neural network model including a plurality of neurons, wherein each neuron has M inputs, each input having a synapse, each neuron having an output indicative of similarity of the inputs to the weights, the parts being connected through a set of connecting wires, the method comprising the steps of:
a) assigning a plurality of neurons so that a different neuron is allotted to each part;
b) initializing the weight of each synapse of each neuron;
c) determining an arrangement of parts by repeating a learning process, the learning process comprising the steps of:
i) inputting a position coordinate to the inputs of the neurons of the neural network;
ii) selecting a fittest neuron responsive to the outputs of the neurons, wherein the fittest neuron is the neuron whose weights are most similar to the input position coordinate;
iii) updating the weights of the synapses of the neurons according to a set of restricting conditions;
iv) assigning the part to which the fittest neuron is assigned to the position identified by the position coordinate; and
v) determining whether an arrangement obtained in the learning process is closer to an optimal arrangement than an arrangement obtained in a previous learning process after a fittest neuron for all the N positions are selected.

61. A computer-implemented system for optimizing an arrangement of N parts wherein N is greater than 1, among N positions in M-dimensions, wherein the system comprises:
means for assigning each of a plurality of neurons to a different part, wherein each neuron has at least M inputs, each input having a synapse, each synapse having a weight, and each neuron having an output indicative of similarity of the inputs to the weights;
means for initializing the weight of each synapse of each neuron;
means for executing a learning cycle, the means for executing including:
i) means for selecting one of the N positions at which a part may be disposed, wherein the position has not been previously selected in the learning cycle;
ii) means for inputting a coordinate of the selected position to each neuron;
iii) means for determining a fittest neuron for the selected coordinate, wherein the fittest neuron is the neuron whose weight are most similar to the input position coordinate;
iv) means for updating the weights of the synapses of the neurons not previously determined to be a fittest neuron in the learning cycle on the basis of the restricting conditions;
v) means for assigning the part to which the fittest neuron is assigned to the position identified by the coordinate; and
vi) means for determining whether an arrangement obtained in the learning cycle is closer to an optimal arrangement than an arrangement obtained in a previous learning cycle, operative after a fittest neuron for each of the N coordinate positions is selected.

62. A system according to claim 61, wherein the means for initializing the weights of the synapses of each neuron includes means for setting the weights to be random numbers.

63. A system according to claim 61, wherein the means for determining the fittest neuron further includes: means, within each neuron, for comparing the coordinate to the weights of the neuron; and
means, responsive to each neuron, for selecting the neuron, having the weights closest to the coordinate.

64. A system according to claim 61, wherein the means for selecting the coordinate position selects the coordinate positions at random.

65. A system according to claim 61, wherein the means for determining the fittest neuron determines a number b, such that b is an index i for which b $\|X_s - W_i\|^2$ is the minimum, wherein Xs represents the selected coordinate position, $W_i$ represents a combination of the weight of each synapse of an i-th neuron, and i represents a neuron which has not been selected in the learning cycle.

66. A system according to claim 65, wherein the means for updating the weights of the synapses of each neuron adds an update amount $\Delta W_i$ to the weight of each neuron which is to be updated, such that $$\Delta W_i = (X_s - W_i) \cdot \epsilon \cdot f(i, b)$$

wherein $\epsilon$ is not more than 1, and $$f(i, b) = 1$$

$$\text{for } i = b$$
$$= \alpha h_{ib} \text{ for } i \neq b$$

wherein $\alpha$ is a predetermined value and $h_{ib}$ represents a number of connections between an i-th part and a b-th part.

67. A system according to claim 66, wherein $\alpha$ is a constant.

68. A system according to claim 61, wherein the means for determining whether the arrangement obtained in the learning cycle is closer to an optimal arrangement includes:
   means for calculating an index which evaluates the arrangement;
   means for comparing the calculated index with an index calculated in a previous learning cycle; and
   means, responsive to the means for comparing, for storing the calculated index when the calculated index is closer to the optimal arrangement than the index calculated in a previous learning cycle.

69. A system according to claim 68, wherein the parts are interconnected by a set of connecting wires and wherein the index is a sum of lengths of the connecting wires.

70. A system as set forth in claim 61 wherein the fittest neuron is determined by comparing the selected coordinate position and the weights of the synapses of neurons not previously determined as fittest neurons.

71. A system as set forth in claim 61 wherein the weights of the synapses of the fittest neuron just previously determined, and the weights of the synapses of neurons assigned to the part which are wired to the parts assigned to the fittest neuron are updated.

* * * * *

UNITED STATES PATENT AND TRADEMARK OFFICE
CERTIFICATE OF CORRECTION

PATENT NO. : 5,416,889
DATED : May 16, 1995
INVENTOR(S) : Masanobu Takahashi and Kazuo Kyuma It is certified that error appears in the above-indentified patent and that said Letters Patent is hereby corrected as shown below:

In the Abstract
    Line 11, delete "other".

In the Drawings
    In Fig. 1a, delete "other" in ST5.

In the Description
    Column 2, line 40, change "(1)" to --(2)--.
    Column 4, line 12, insert the suffix "i" under "argmin" in the equation.
    Column 4, line 67, delete "other" and column 5, line 26, delete "other".
    Column 6, line 40, delete "other" and column 8, line 5, delete "other".
    Column 6, line 18, change ""0" 0 " to --"0"--.
    Column 7, line 39, change "$X_i-W_i$" to --$(X_s-W_i)$--.

Column 2, line 6, change "$n_7$" to --$n_8$--.
    Column 4, line 63, delete "sleeting" and insert --selecting--.
    Column 5, line 22, delete "sleeting" and insert --selecting--.
    Column 3, lines 28-29, delete "proportional".

Column 8:

In claim 4, line 5, change "$X_s-W_i\| 2$" to --$\|X_s-W_i\| 2$--.

UNITED STATES PATENT AND TRADEMARK OFFICE
CERTIFICATE OF CORRECTION

PATENT NO. : 5,416,889
DATED : May 16, 1995
INVENTOR(S) : Masanobu Takahashi, et al.

It is certified that error appears in the above-indentified patent and that said Letters Patent is hereby corrected as shown below:

```
Column 10, Claim 17, line 20, delete "nearons" and insert --neurons--.
Column 12, Claim 32, line 1, delete "22" and insert --31--.
           Claim 34, line 9, delete "a•hib" and insert --α•hib--.
           Claim 38, line 1, delete "to claim 15" and insert --according
              to claim 27--.
           Claim 39, line 3 and claim 49, line 3, delete "of".
Column 9,  Claim 6, line 1, delete "claim 6" and insert --claim 5--.

Column 9,  Claim 14, line 1, delete "claim 3" and insert --claim 13--.
Column 10, Claim 22, line 3, delete "of".
Column 14, Claim 49, line 15 should be indented.
Column 15, In claim 53, line 1, after "step" insert --of--.
Column 11, Claim 65, line 4, delete the second occurrence of "b".
```

Signed and Sealed this

Twenty-third Day of January, 1996

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,416,889
DATED : May 16, 1995
INVENTOR(S) : Masanobu Takahashi and Kazuo Kyuma It is certified that error appears in the above-indentified patent and that said Letters Patent is hereby corrected as shown below:

In column 2, line 6, change "n7", second occurrence only, to --n8--.
In column 6, rewrite equation 5 as follows:

$$-- \quad b = \underset{i \in U}{\mathrm{argmin}} \, (\|X_s - W_i\|^2) \qquad (5) \quad --.$$

Signed and Sealed this

Third Day of September, 1996

*Attest:*

BRUCE LEHMAN

*Attesting Officer*     *Commissioner of Patents and Trademarks*